US006664586B2

(12) United States Patent
Liu et al.

(10) Patent No.: US 6,664,586 B2
(45) Date of Patent: Dec. 16, 2003

(54) MEMORY DEVICE AND MANUFACTURING METHOD THEREOF

(75) Inventors: Kuang-Wen Liu, Nantou County (TW); Chong-Jen Huang, Taipei (TW); Jui-Lin Lu, Hsinchu (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 10/193,634

(22) Filed: Jul. 10, 2002

(65) Prior Publication Data
US 2003/0198095 A1 Oct. 23, 2003

(30) Foreign Application Priority Data

Apr. 15, 2002 (TW) ........................................ 91107675 A

(51) Int. Cl.$^7$ ................................................ H01L 29/76
(52) U.S. Cl. ........................................................ 257/314
(58) Field of Search ................................. 257/314, 315, 257/316

(56) References Cited
U.S. PATENT DOCUMENTS 6,545,306 B2 * 4/2003 Kim et al. .................. 257/296

* cited by examiner

Primary Examiner—Hoai Ho
Assistant Examiner—Quoc D Hoang
(74) Attorney, Agent, or Firm—Martine & Penilla, LLP

(57) ABSTRACT

The invention provides a memory device including a memory substrate, an insulating layer, a shielding metal layer, a second dielectric layer and a second metal layer. The memory substrate includes a substrate, a memory cell area, a peripheral circuit area, a first dielectric layer and a first metal layer. The first dielectric layer is formed on the memory area and the peripheral circuit area, which are formed on the substrate. The first metal layer is formed on the first dielectric layer while the insulating layer is formed on the first dielectric layer not covered with the first metal layer. The shielding metal layer is formed on the insulating layer over the memory cell area. The second dielectric layer is formed on the shielding metal layer, the insulating layer not covered with the shielding metal layer and the first metal layer not covered with both the shielding layer and the insulating layer. The second metal layer is formed on the second dielectric layer.

12 Claims, 2 Drawing Sheets

MEMORY DEVICE AND MANUFACTURING METHOD THEREOF

BACKGROUND OF THE INVENTION

1. Field of the Invention

The invention relates to a memory device and manufacturing method thereof and, more particularly, to a memory device with, a shielding metal layer over a memory cell area, and manufacturing method thereof.

2. Description of the Related Art

An ionization process is an important step in semiconductor fabrication technology and is used as one of back-end processes. For example, an ionization process is used to perform an etching process or a physical vapor deposition (PVD) process.

However, when performing an, ionization process, a great quantity of plasma is produced in the chamber of the process apparatus. The plasma usually carries a large amount of charges, causing semiconductor elements to carry charges, which deteriorates stability and reliability of the semiconductor elements.

Taking a memory element as an example, especially for more advanced flash memory (flash RAM) or silicon nitride memory (NROM), memory cells of the memory are formed by floating gate technology. As described above, when performing back-end processes to form a memory element, a great quantity of plasma with a large amount of charges attacks memory cells of the memory element. To go into details, the plasma charges are trapped in memory cells of the memory element, which results in problems to program, write, or read the memory element, further resulting in semiconductor elements with bad stability and reliability.

To sum up, for semiconductor technology it is an important subject to avoid plasma charges being trapped in memory cells of a memory element when performing back-end semiconductor processes, and further increase stability and reliability of the memory element.

SUMMARY OF THE INVENTION

In view of the above-mentioned subject, it is therefore an object of the invention to provide a memory device that is able to shield plasma charges to avoid the charges being trapped in memory cells, and manufacturing method thereof.

To achieve the above-mentioned object, a memory device in accordance with the invention includes a memory substrate, an insulating layer, a shielding metal layer, a second dielectric layer and a second metal layer. In the invention, the memory substrate includes a substrate, a memory cell area, a peripheral circuit area, a first dielectric layer and a first metal layer. The memory cell area and the peripheral circuit area are formed on the substrate; the first dielectric layer is formed on the memory cell area and the peripheral circuit area. The first metal layer is formed on the first dielectric layer. The insulating layer is formed on the first dielectric layer not covered with the first metal layer. The shielding metal layer is formed on the insulating layer over the memory cell area. On the shielding metal layer, the insulating layer not covered with the shielding metal layer and the first metal layer not covered with the shielding metal layer and the insulating layer is formed the second dielectric layer. The second metal layer is formed on the second dielectric layer.

In addition, in accordance with another aspect of the invention, the memory substrate further includes a spacer and a barrier layer. In which, the spacer is formed at sides of the first metal layer, while the barrier layer is formed over the first dielectric layer and under the first metal layer and the spacer.

The invention also discloses a method for forming a memory device including steps of providing a memory substrate, depositing an insulating layer, depositing a shielding metal layer, etching the insulating layer and the shielding metal layer, forming a second dielectric layer and forming a second metal layer.

As described above, in accordance with the memory device and manufacturing method thereof of the invention, the shielding metal layer is formed on the insulating layer over the memory cell area. Therefore, the shielding metal layer can shield plasma charges produced when performing back-end semiconductor processes and avoid the plasma charges being trapped in the gate of the memory cell, thereby increasing stability and reliability of the memory element.

DESCRIPTION OF THE PREFERRED EMBODIMENT

The memory device and manufacturing method thereof in accordance with a preferred embodiment of the invention will be described with reference to the accompanying drawings, wherein the same reference numbers denote the same elements.

Figure 1:
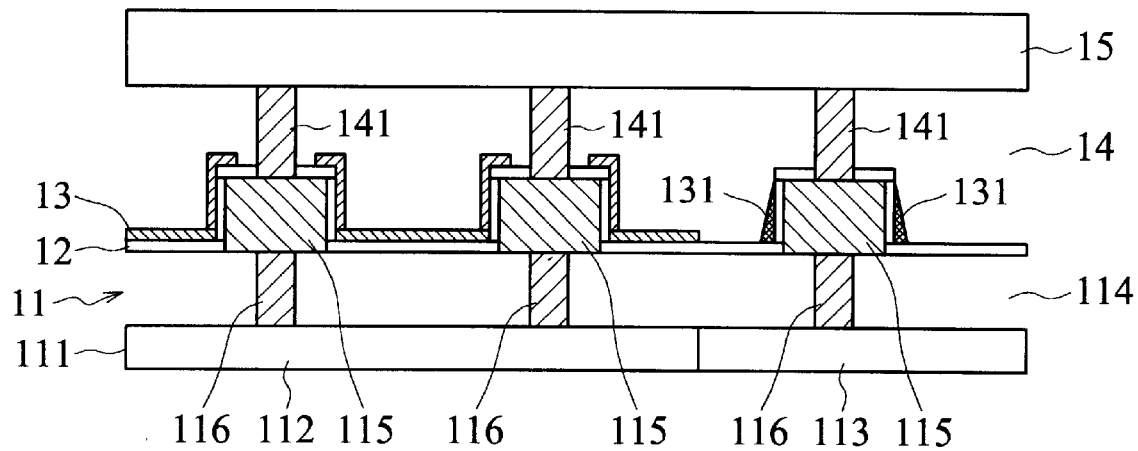
FIG. 1 is a schematic diagram showing a memory device in accordance with an embodiment of the invention.

Referring to FIG. 1, a memory device 1 in accordance with an embodiment of the invention includes a memory substrate 11, an insulating layer 12, a shielding metal layer 13, a second dielectric layer 14 and a second metal layer 15.

In this embodiment, the memory substrate 11 includes a substrate 111, a memory cell area. 112, a peripheral circuit area 113, a first dielectric layer 114 and a first metal layer 115. The memory cell area 112 and the peripheral circuit area 113 are formed on the substrate 111, the first dielectric layer 114 is formed on the memory cell area 112 and peripheral circuit area 113, and the first metal layer 115 is formed on the first dielectric layer 114. Those skilled in the art should know that the memory cell area 112 has a plurality of memory cells and the memory cells are electrically connected to a plurality of word lines and a plurality of bit lines, respectively. Besides, the word lines and bit lines are constituted by metal layers of the memory device 1 (including the first metal layer 115 and the second metal layer 15). Since the circuit design of the memory cells and the metal layers is well-known to those skilled in the art, description thereof is omitted here. The peripheral circuit area 113 is used to control access to each of the memory cells. The first dielectric layer 114 can be an inter-layer dielectric layer (ILD). A plurality of contact holes 16 are formed in the first dielectric layer 114. Therefore, the first metal layer 115 can be electrically connected to the memory cell area 112 and the peripheral circuit area 113 through the contact holes 116, so as to form a circuit layout in accordance with a desired design.

Figure 2:
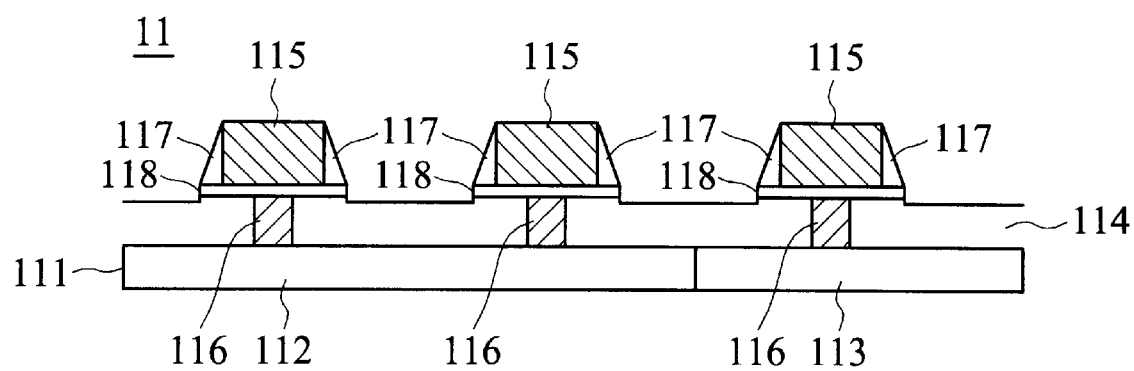
FIG. 2 is a schematic diagram showing a memory substrate of the memory device shown in FIG. 1.

In addition, in another embodiment of the invention, the memory substrate 11 can further include a spacer 117 and a barrier layer 118. As shown in FIG. 2, the spacer 117 is formed at sides of the first metal layer 115, and the barrier layer 118 is formed between the first dielectric layer 114, and the first metal layer 115 and spacer 117. In which, the barrier layer 118 can be made of titanium nitride or titanium, so as to shield the large amount of plasma charges produced in back-end semiconductor processes.

Referring again to FIG. 1, the insulating layer 12 is formed on the memory substrate 11 and also on the first dielectric layer 114 not covered with the first metal layer 115.

The shielding metal layer 13 is formed on the insulating layer 12 over the memory cell area 112. In this embodiment, the shielding metal layer 13 can be made of silicon nitride, titanium nitride, or titanium.

As shown in FIG. 1, the second dielectric layer 14 is formed on the shielding metal layer 13, the insulating layer 12 not covered with the shielding metal layer 13 and the first metal layer 115 not covered with the shielding metal layer 13 and the insulating layer 12. In this embodiment, the second dielectric layer 14 is an inter-metal dielectric layer (IMD).

Finally, the second metal layer 15 is formed on the second dielectric layer 14. The second metal layer 15 is electrically connected to the first metal layer 115 through a plurality of contact holes 141 formed in the second dielectric layer 14, so as to form a circuit layout in accordance with a desired design.

Figure 3A:
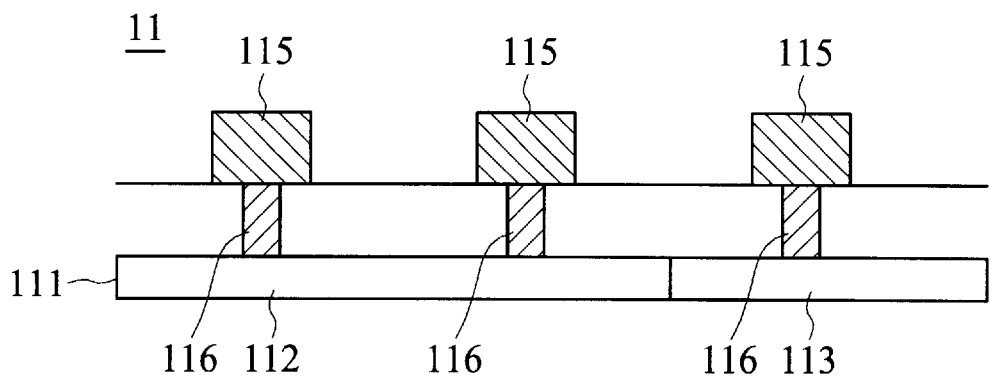
FIGS. 3A to 3C are schematic diagrams showing steps for forming the memory device in accordance, with the embodiment of the invention.
Figure 3B:
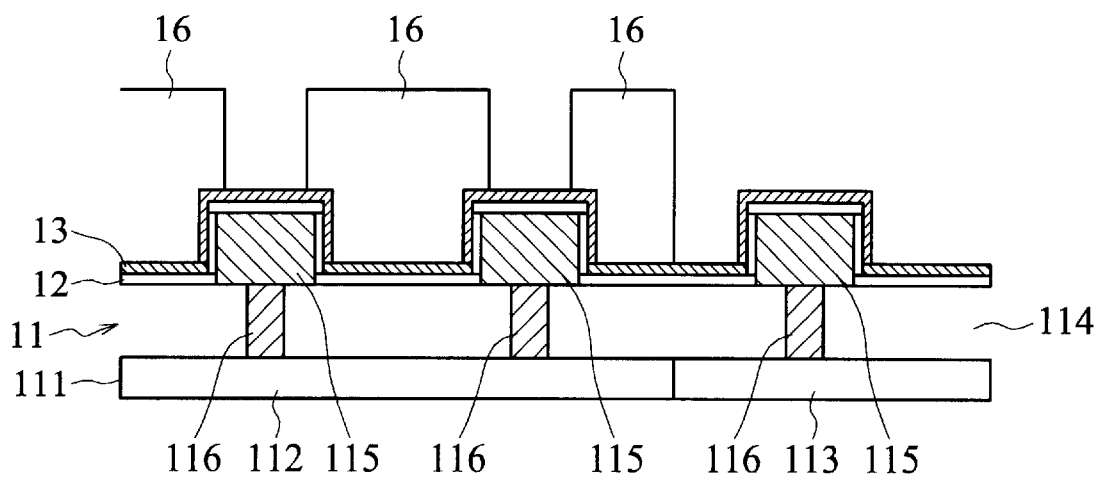
Figure 3C:
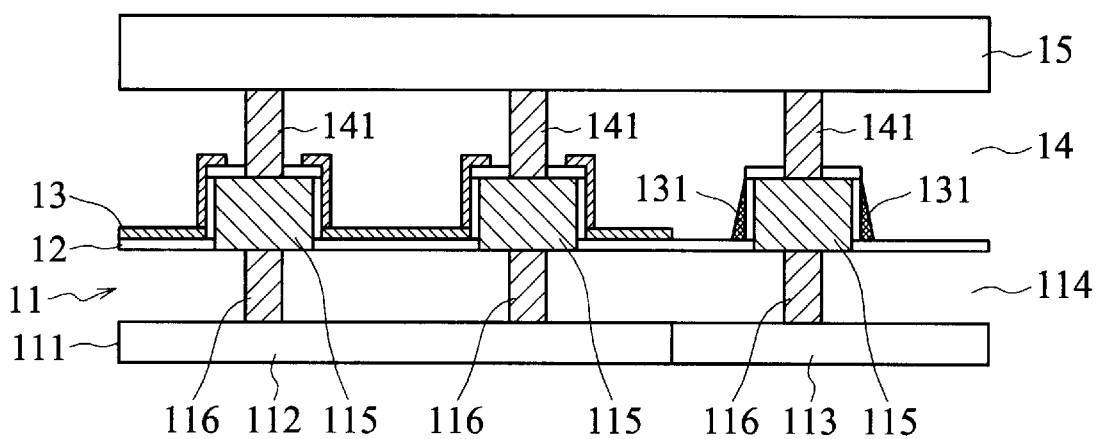

To facilitate easy understanding of the invention, a method as an example is illustrated to show steps in manufacturing the memory device in accordance with. the invention. Referring to FIGS. 3A to 3C, the method includes the following steps.

First, as shown in FIG. 3A, a memory substrate 11 is provided. It should be noted that the memory substrate 11 may include a spacer 117 and a barrier layer 118 as shown in FIG. 2 so that the memory device 1 is enhanced with its ability to shield plasma charges.

Then, an insulating layer 12 is deposited on a first metal layer 115 and a first dielectric layer 114 not covered with the first metal layer 115 as shown in FIG. 3A. In this embodiment, the insulating layer. 12 can be formed by physical vapor deposition (PVD) or chemical vapor deposition (CVD).

Next, a shielding metal layer 13 is deposited on the insulating layer 12 as shown in FIG. 3A. As described above, the shielding metal-layer 13 can also be formed by PVD or CVD.

Referring to FIG. 3B, the insulating layer 12 and the shielding metal layer 13 are etched, so as to remove the insulating layer 12 and shielding metal layer 13 over first metal layer 115, and to remove the shielding metal layer 13 over the peripheral circuit area 113. In this embodiment, a dry etching process is used to etch the insulating layer 12 and the shielding metal layer 13. Therefore, after the etching process, spacers 131 are formed at both sides of the first metal layer 115. Those skilled in the art should know that the above-mentioned etching process includes forming a resist layer 16 with a certain pattern on the shielding metal layer 13 before performing the etching process, as shown in FIG. 3B, and removing the resist layer 16 after etching.

Referring to FIG. 3C, a second dielectric layer 14 is then formed to cover the shielding metal layer 13, the insulating layer 12 not covered with the shielding metal layer 13, and the first metal layer 115 not covered with the shielding metal layer 13 and insulating layer 12. It should be noted that after forming the second dielectric layer 14, a plurality of contact holes 141 must be formed in the second dielectric layer 14 to electrically connect to the first metal layer 115.

Finally, a second metal layer 15 is formed on the second dielectric layer 14. As described above, through the contact holes 141 and 116, control signals are input to each memory cell in the memory cell area 112 via the first metal layer 115 and the second metal layer 15, thereby controls access to each memory cell in the memory cell area 112. In addition, through the contact holes 141 and 116, control signals can be input to the peripheral circuit area 113 via the first metal layer 115 and the second metal, layer 15, respectively, to activate circuits in the peripheral circuit area 113 to, for example, perform logic analyses.

It should be noted that the shielding layer 118 and the metal shielding layer 13 can be formed by any metal or non-metal material that can be used in a semiconductor process and has the ability to shield plasma charges. Therefore, the material is not limited to silicon nitride, titanium nitride, or titanium described in this embodiment.

To sum up, the memory device and manufacturing method thereof in accordance with the embodiment of the invention is to form a shielding metal layer on the insulating layer over the memory cell area. Therefore, the shielding metal layer can protect the memory cell from plasma charges being trapped in its gate when performing semiconductor back-end processes, thereby increasing stability and reliability of the memory element.

While the invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the invention.

What is claimed is:

1. A memory device comprising:
   a memory substrate including a substrate, a memory cell area, a peripheral circuit area, a first dielectric layer and a first metal layer, wherein the memory cell area and the peripheral circuit area are formed on the substrate, the first dielectric layer is formed on the memory cell area and the peripheral circuit area, and the first metal layer is formed on the first dielectric layer;
   an insulating layer formed on the first dielectric layer not covered with the first metal layer;
   a shielding metal layer formed on the insulating layer over the memory cell area;
   a second dielectric layer formed on the shielding metal layer, the insulating layer not covered with the shielding metal layer, and the first metal layer not covered with the shielding metal layer and the insulating layer; and
   a second metal layer formed on the second dielectric layer.

2. The memory device as in claim 1, wherein the first dielectric layer is an ILD.

3. The memory device as in claim 1, wherein the second dielectric layer is an IMD.

4. The memory device as in claim 1, wherein the first metal layer is electrically connected to the memory cell area and the peripheral circuit area through a plurality of contact holes formed in the first dielectric layer.

5. The memory device as in claim 1, wherein the second metal layer is electrically connected to the first metal layer through a plurality of contact holes formed in the second dielectric layer.

6. The memory device as in claim 1, wherein the shielding metal layer is formed by silicon nitride.

7. The memory device as in claim 1, wherein the shielding metal layer is formed by titanium nitride.

8. The memory device as in claim 1, wherein the shielding metal layer is formed by titanium.

9. The memory device as in claim 1, wherein the memory substrate further comprises a spacer formed at sides of the first metal layer.

10. The memory device as in claim 9, wherein the memory substrate further comprises a barrier layer formed over the first dielectric layer and under the first metal layer and the spacer.

11. The memory device as in claim 10, wherein the barrier layer is formed by titanium nitride.

12. The memory device as in claim 10, wherein the barrier layer is formed by titanium.

* * * * *